US009831129B2

(12) United States Patent
Shimanuki

(10) Patent No.: US 9,831,129 B2
(45) Date of Patent: Nov. 28, 2017

(54) SEMICONDUCTOR DEVICE MANUFACTURING METHOD

(71) Applicant: Renesas Electronics Corporation, Tokyo (JP)

(72) Inventor: Yoshihiko Shimanuki, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/416,390

(22) Filed: Jan. 26, 2017

(65) Prior Publication Data

US 2017/0287783 A1 Oct. 5, 2017

(30) Foreign Application Priority Data

Mar. 30, 2016 (JP) ................................ 2016-067179

(51) Int. Cl.
*H01L 21/78* (2006.01)
*H01L 23/544* (2006.01)
*H01L 21/683* (2006.01)
*H01L 21/56* (2006.01)

(52) U.S. Cl.
CPC ............ *H01L 21/78* (2013.01); *H01L 21/561* (2013.01); *H01L 21/6836* (2013.01); *H01L 21/6838* (2013.01); *H01L 23/544* (2013.01); *H01L 2221/6834* (2013.01); *H01L 2221/68327* (2013.01); *H01L 2221/68368* (2013.01); *H01L 2223/5446* (2013.01)

(58) Field of Classification Search
None
See application file for complete search history.

(56) References Cited

U.S. PATENT DOCUMENTS

| 7,611,766 | B2 | 11/2009 | Fuyumuro et al. | |
|---|---|---|---|---|
| 2002/0144927 | A1* | 10/2002 | Brooks | H01L 21/67356 206/710 |
| 2004/0048028 | A1* | 3/2004 | Thomas | B65D 81/05 428/64.1 |

FOREIGN PATENT DOCUMENTS

| JP | 08-330407 A | 12/1996 |
|---|---|---|
| WO | 2004/089784 A1 | 10/2004 |

* cited by examiner

*Primary Examiner* — Angel Roman
*Assistant Examiner* — Kevin Quinto
(74) *Attorney, Agent, or Firm* — Mattingly & Malur, PC

(57) ABSTRACT

A semiconductor device manufacturing method which improves working efficiency. The method includes the step of transporting by air a package as a sealed moisture-proof bag which contains a case housing a semiconductor wafer laminate, in which the semiconductor wafer laminate has a plurality of semiconductor wafers stacked with a protective sheet interposed between semiconductor wafers. In order to facilitate separation of the protective sheet from the semiconductor wafers after unpacking the package, the protective sheet has a plurality of convex parts, a plurality of concave parts, and a flat part between a convex part and a concave part. A hole penetrating the protective sheet is made in each convex part and the center of the hole is located off the apex of the convex part.

14 Claims, 16 Drawing Sheets

SEMICONDUCTOR DEVICE MANUFACTURING METHOD

CROSS-REFERENCE TO RELATED APPLICATIONS

The disclosure of Japanese Patent Application No. 2016-067179 filed on Mar. 30, 2016 including the specification, drawings and abstract is incorporated herein by reference in its entirety.

BACKGROUND

The present invention relates to technology useful for a semiconductor device manufacturing method which includes the step of transporting, for example, a container housing stacked semiconductor wafers.

WO 2004/089784 concerns a wafer protective sheet which is inserted between semiconductor wafers to protect the semiconductor wafers when the semiconductor wafers are stacked and housed in a container. It discloses that when a plurality of semiconductor wafers are put in a container and transported with a lid on the container, a protective sheet of synthetic resin which has many projected and recessed parts on the front and back surfaces is interposed between wafers to protect the semiconductor wafers against vibrations during transportation.

Japanese Unexamined Patent Application Publication No. Hei 08 (1996)-330407 discloses a cushion material for transportation of semiconductor wafers which is a porous resin sheet.

SUMMARY

The manufacture of semiconductor devices includes the process of forming a semiconductor element and wirings for an integrated circuit, for example, on a semiconductor wafer as a thin silicon monocrystalline disc (semiconductor substrate) (this process is called the "front-end process") and the process of dividing the semiconductor wafer into a plurality of semiconductor chips and packaging the individual semiconductor chips (this process is called the "back-end process"). In recent years, as the trend toward globalization and division of labor grows in the manufacture of semiconductor devices, there are many cases that the front-end process and the back-end process are carried out at different production sites. Specifically, in many cases, the semiconductor wafers which have undergone the front-end process are transported by air to the production site for the back-end process where the back-end process is carried out to complete semiconductor devices.

The semiconductor devices which the present inventors have researched involve a process in which a semiconductor wafer laminate with a protective sheet put between semiconductor wafers is put in a lidded container (called the "case") and the case is housed in a moisture-proof bag and transported (by air). Like the technique disclosed in WO 2004/089784, the protective sheet has a plurality of projected (convex) and recessed (concave) parts on its both surfaces. In addition, in order to prevent displacement and vibration of the semiconductor wafers, a cushion material is interposed between the semiconductor wafer laminate and the case. Therefore, the semiconductor wafers and the protective sheets are pressed by the case through the cushion material. Furthermore, in order to prevent the semiconductor wafers from absorbing moisture, the case housing the semiconductor wafer laminate is put in the sealed moisture-proof bag together with a desiccating agent and the inside of the moisture-proof bag is vacuumed before being sealed.

However, the research by the present inventors has revealed the following problem.

It has been found that when the transported semiconductor wafers are taken out of the moisture-proof bag and, for example, sucked and conveyed by the vacuum suction unit of a mounting device or the like, the protective sheet may also be conveyed while held on a semiconductor wafer, causing a problem in the subsequent semiconductor wafer processing step. In other words, the following problem has become apparent: when the semiconductor wafer is conveyed by vacuum suction, it is difficult to hold and convey only the semiconductor wafer while leaving the protective sheet behind, thus resulting in a decline in working efficiency in the semiconductor device manufacturing process.

The present inventors consider that the problem occurs for the following reason: the projected parts on the front and back surfaces of the protective sheet are crushed by one third to one half of their height and thus the protective sheet sticks fast to the semiconductor wafer. Since the semiconductor wafer laminate is pressed by the case and housed in the vacuumed moisture-proof bag, the synthetic resin protective sheet is easily sucked to the semiconductor wafer. Particularly, since the back surface of the semiconductor wafer is specular-finished at the back surface polishing step, the protective sheet is easily sucked. In addition, in the case of transportation by air, the air pressure inside the airplane in the sky is low (approximately 810 hPa) and the gas in the sealed moisture-proof bag expands and its stress is applied to the semiconductor wafer, and thus the protective sheet becomes easier to stick to the semiconductor wafer. Although the projected parts and recessed parts are densely arranged on the front and back surfaces of the protective sheet, they are crushed by about one third to one half of their height and thus the space between the semiconductor wafer and the protective sheet becomes extremely small. For this reason, it is considered that even when the semiconductor wafer laminate is released in the atmospheric air, the air cannot reach the center area of the semiconductor wafer and the protective sheet is not peeled from the semiconductor wafer.

In this respect, improvement in working efficiency is needed in the semiconductor device manufacturing method.

The above and further objects and novel features of the invention will more fully appear from the following detailed description in this specification and the accompanying drawings.

According to one aspect of the present invention, there is provided a semiconductor device manufacturing method which includes the step of providing a plurality of semiconductor wafers each having a plurality of chip regions arranged in a matrix pattern on a main surface of a semiconductor substrate and scribe regions arranged between the chip regions in a lattice pattern and the packaging step of putting a semiconductor wafer laminate in which the semiconductor wafers are stacked with a protective sheet interposed between semiconductor wafers, in a moisture-proof bag, deairing the inside of the moisture-proof bag and then sealing the moisture-proof bag. The method further includes the step of transporting the packaged semiconductor wafer laminate by air and the step of taking the semiconductor wafer laminate out of the moisture-proof bag and then sucking and moving a first semiconductor wafer of the semiconductor wafer laminate to a stage by a first suction unit and attaching a tape to the back surface of the first semiconductor wafer. The method further includes the step of forming a plurality of semiconductor chips by cutting the first semiconductor wafer along the scribe regions. The protective sheet has a first surface and a second surface opposite to the first surface and the first surface has a flat part, a plurality of convex parts projecting from the flat part toward the first surface, and a plurality of concave parts projecting from the flat part toward the second surface and a hole penetrating the protective sheet is made in each convex part, and the center of the hole is located off the apex of the convex part.

According to the present invention, working efficiency is improved in the semiconductor device manufacturing method.

DETAILED DESCRIPTION

The preferred embodiments of the present invention may be described below in different sections or separately as necessary or for the sake of convenience, but the embodiments described as such are not irrelevant to each other unless otherwise stated. One embodiment may be, in whole or in part, a modified, detailed or supplementary form of another.

In the preferred embodiments described below, when numerical information for an element (the number of pieces, numerical value, quantity, range, etc.) is given by a specific number, it is not limited to the specific number unless otherwise stated or theoretically limited to the specific number; it may be larger or smaller than the specific number.

In the preferred embodiments described below, constituent elements (including constituent steps) are not necessarily essential unless otherwise stated or theoretically essential.

Similarly, in the preferred embodiments described below, when a specific form or positional relation is indicated for an element, it should be interpreted to include a form or positional relation which is substantially equivalent or similar to the specific form or positional relation unless otherwise stated or theoretically limited to the specific form or positional relation. The same is true for the above numerical values and ranges.

In all the drawings that illustrate an embodiment, basically, the same members are designated by the same reference signs and repeated descriptions thereof are omitted. For easy understanding, hatching may be used even in plan view.

EMBODIMENT

Next, a semiconductor device manufacturing method according to an embodiment of the present invention will be described.

<Semiconductor Device Manufacturing Method>

Figure 1:
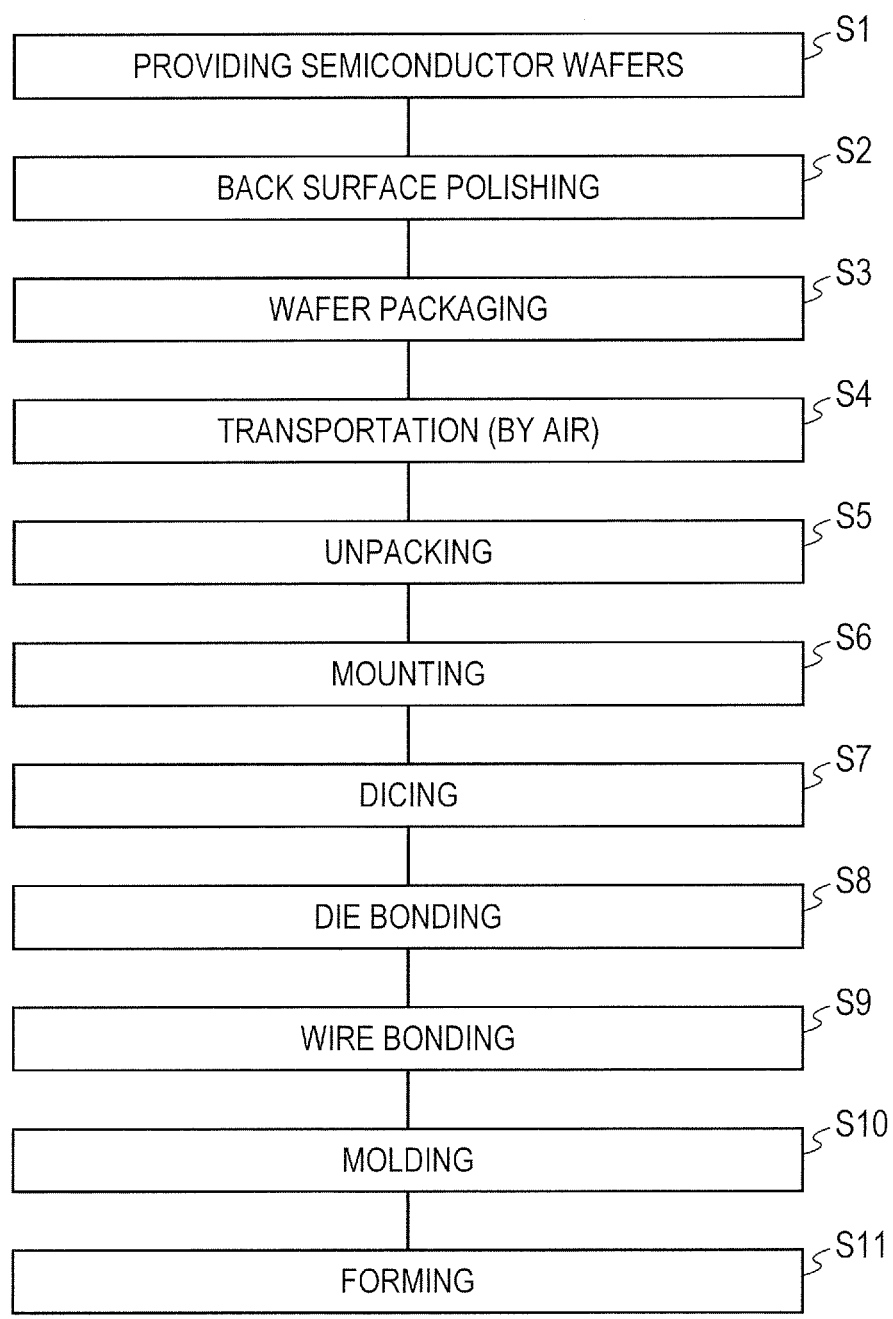
FIG. 1 is a process flow chart showing part of a semiconductor device manufacturing process according to an embodiment of the invention.
Figure 2:
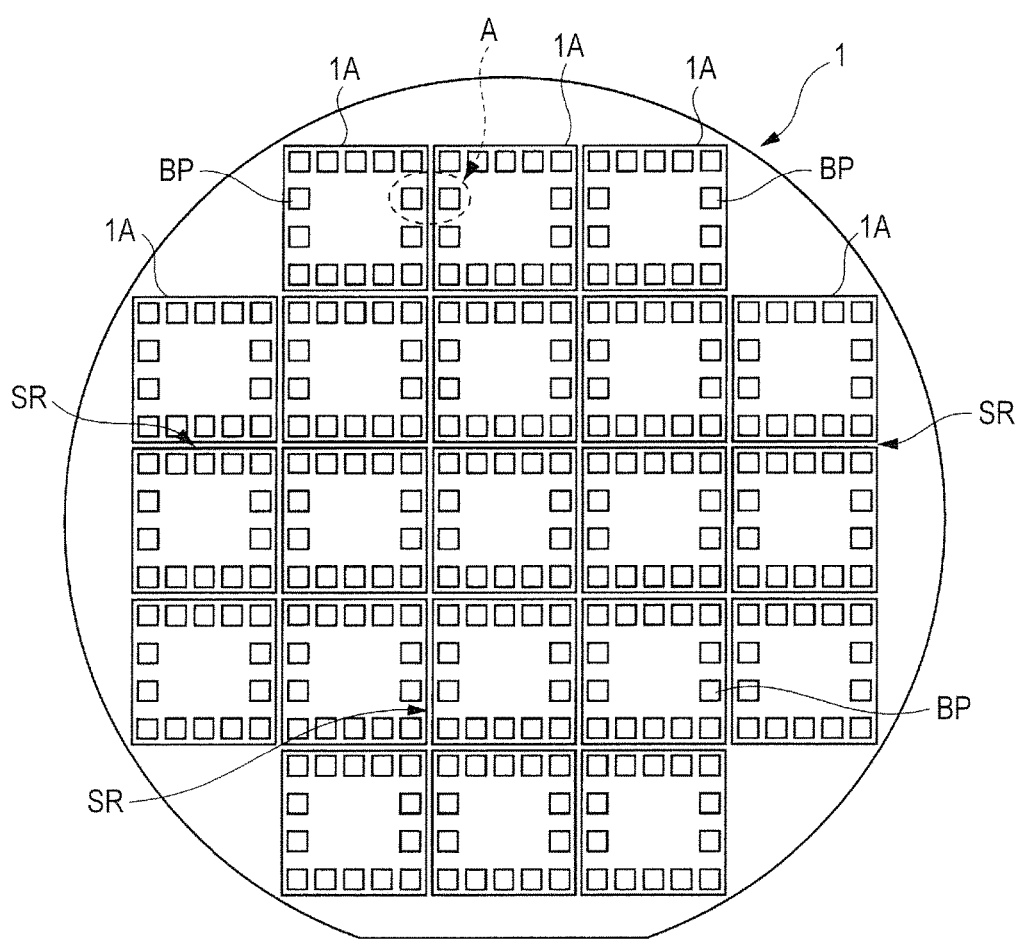
FIG. 2 is a plan view of a semiconductor wafer according to the embodiment.
Figure 3:
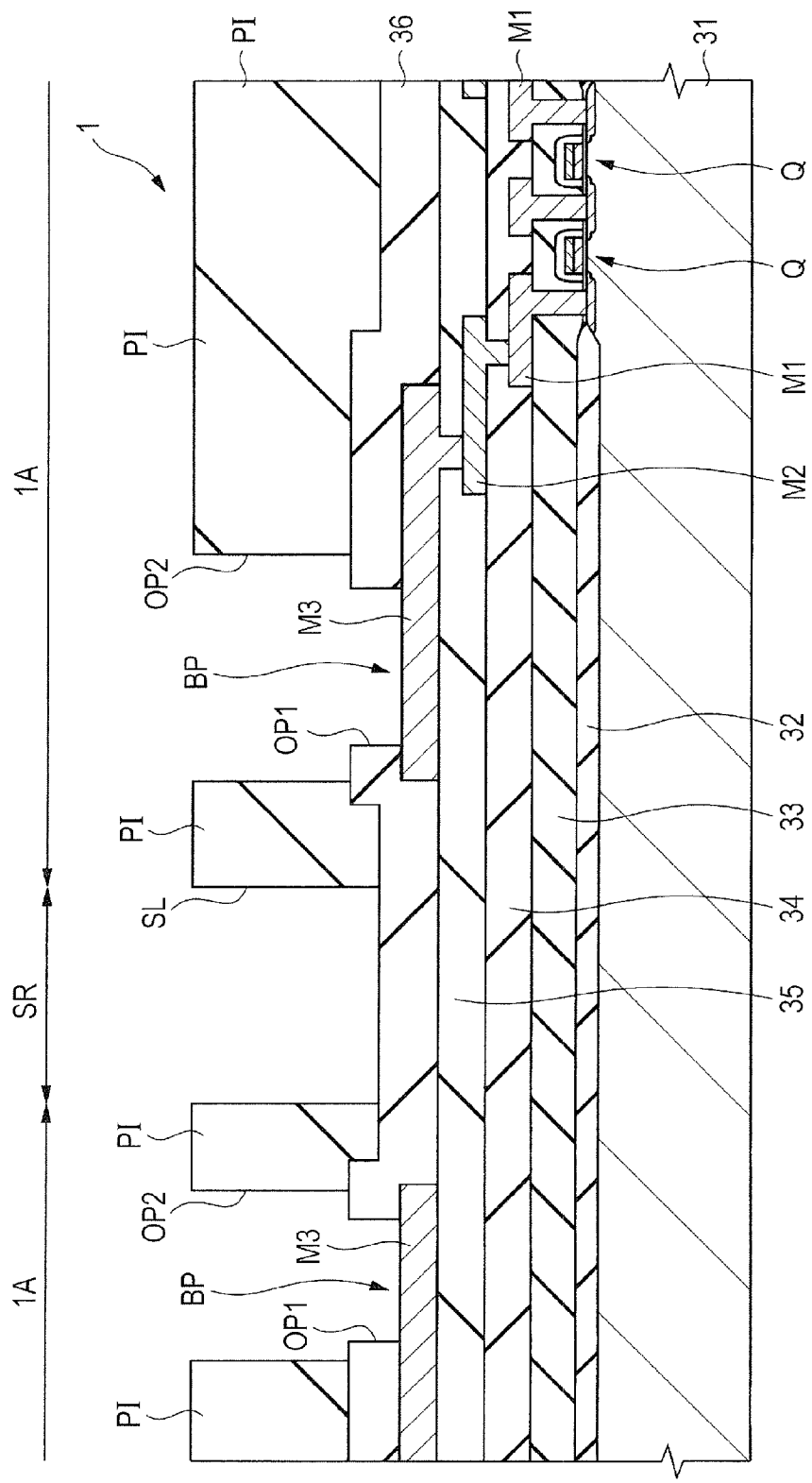
FIG. 3 is a sectional view showing a step in the semiconductor device manufacturing process according to the embodiment.
Figure 4:
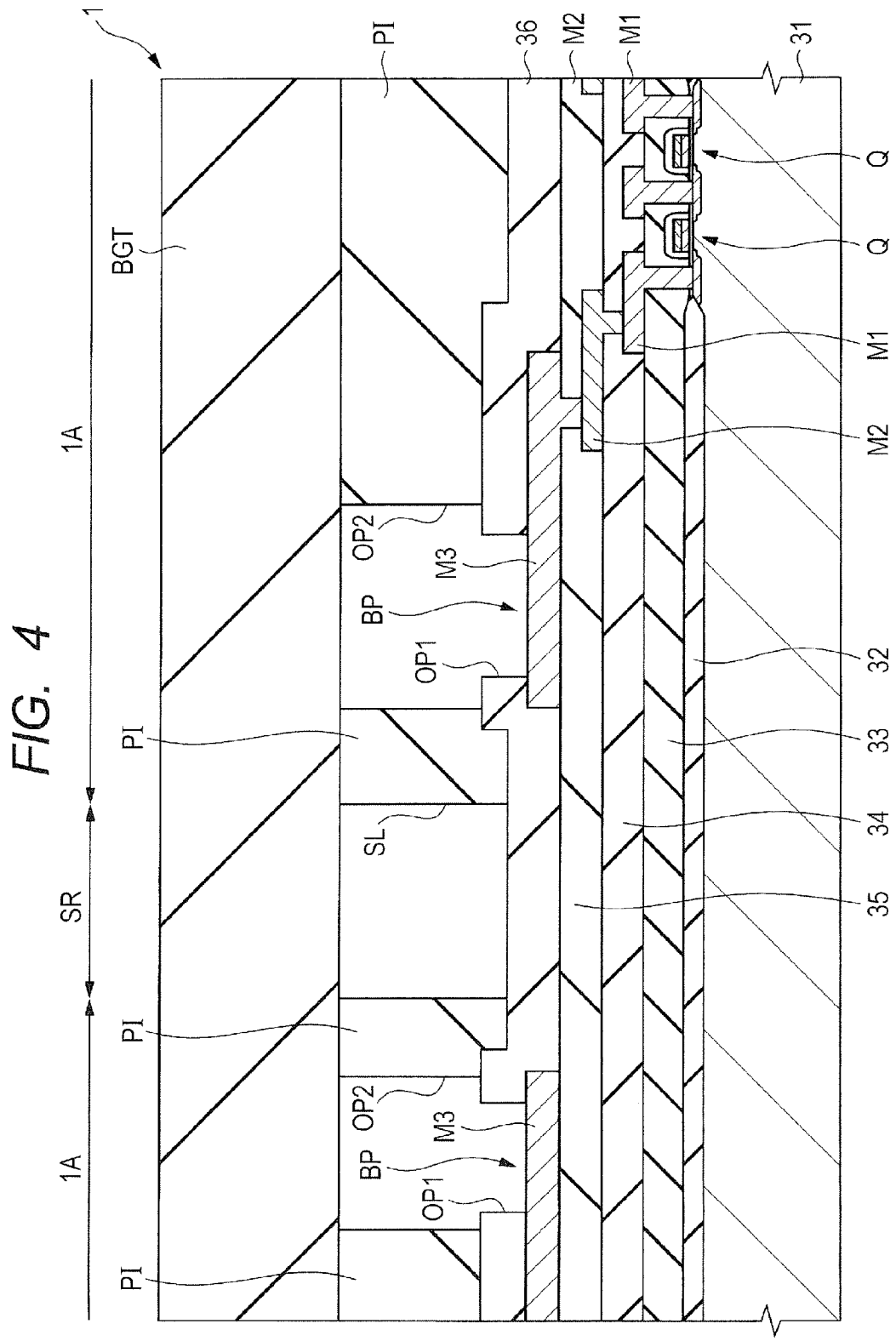
FIG. 4 is a sectional view showing a step subsequent to the step shown in FIG. 3.
Figure 5:
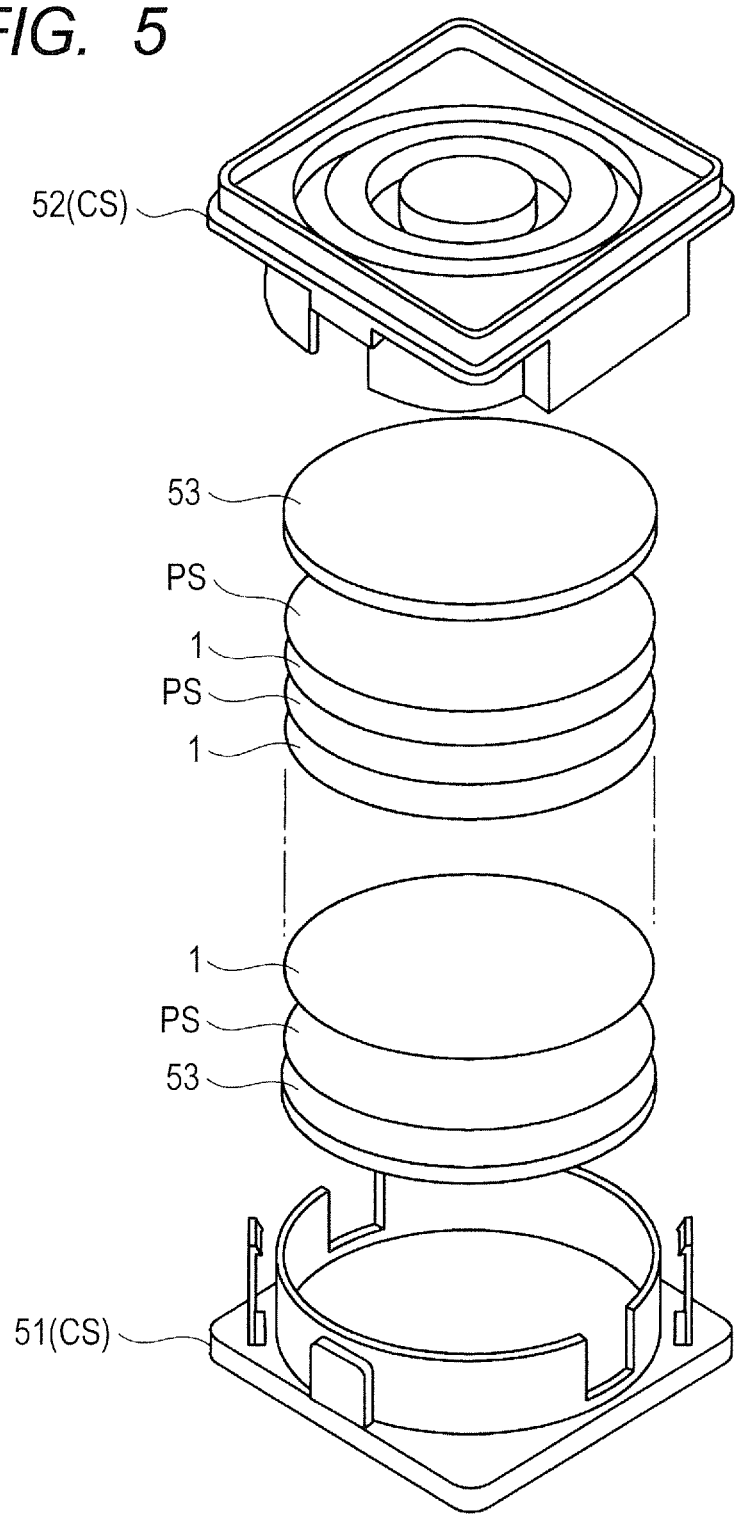
FIG. 5 is a perspective view showing the external appearance of a case according to the embodiment.
Figure 6:
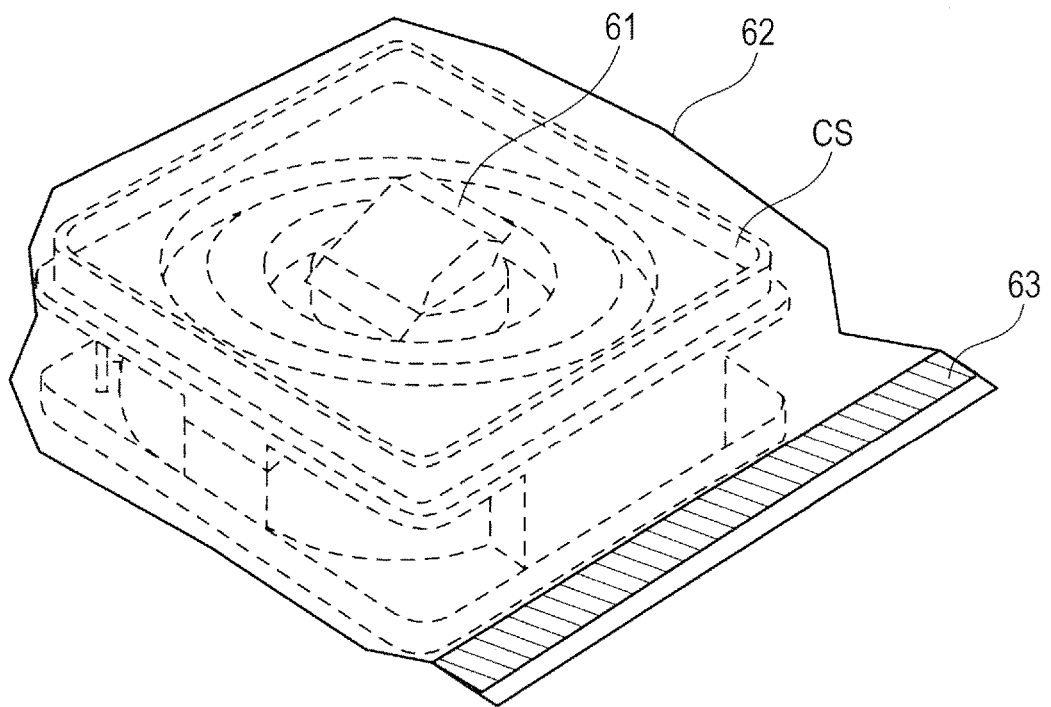
FIG. 6 is a transparent view of the case sealed and packed in the moisture-proof bag according to the embodiment.
Figure 7:
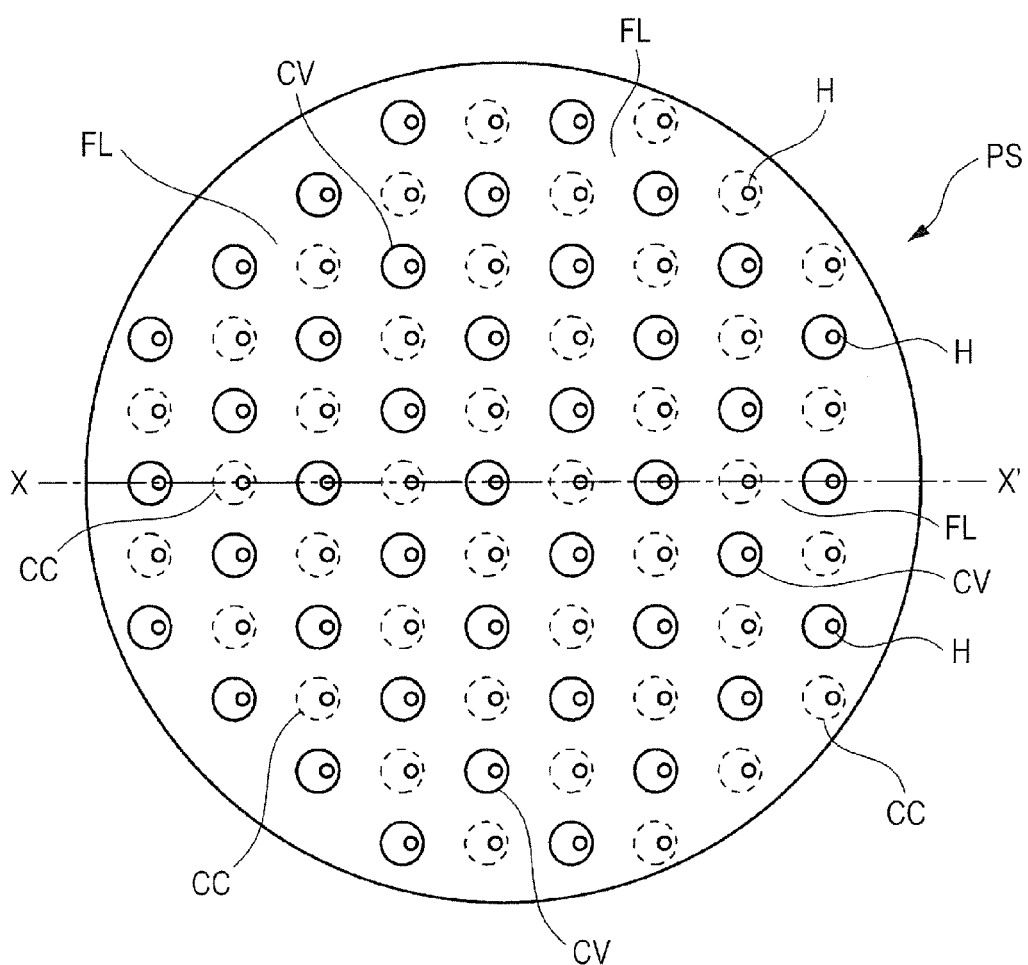
FIG. 7 is a plan view of a protective sheet according to the embodiment.
Figure 8:
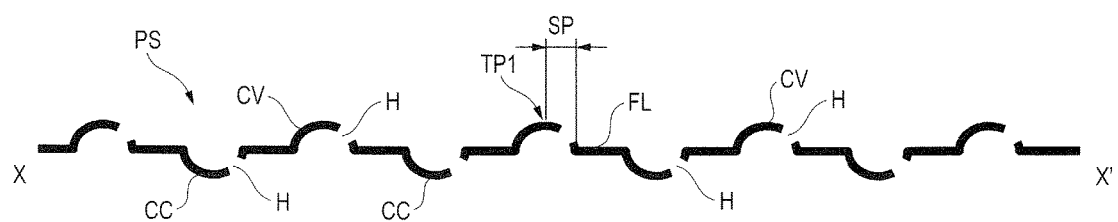
FIG. 8 is a sectional view taken along the line X-X' of FIG. 7.
Figure 9:
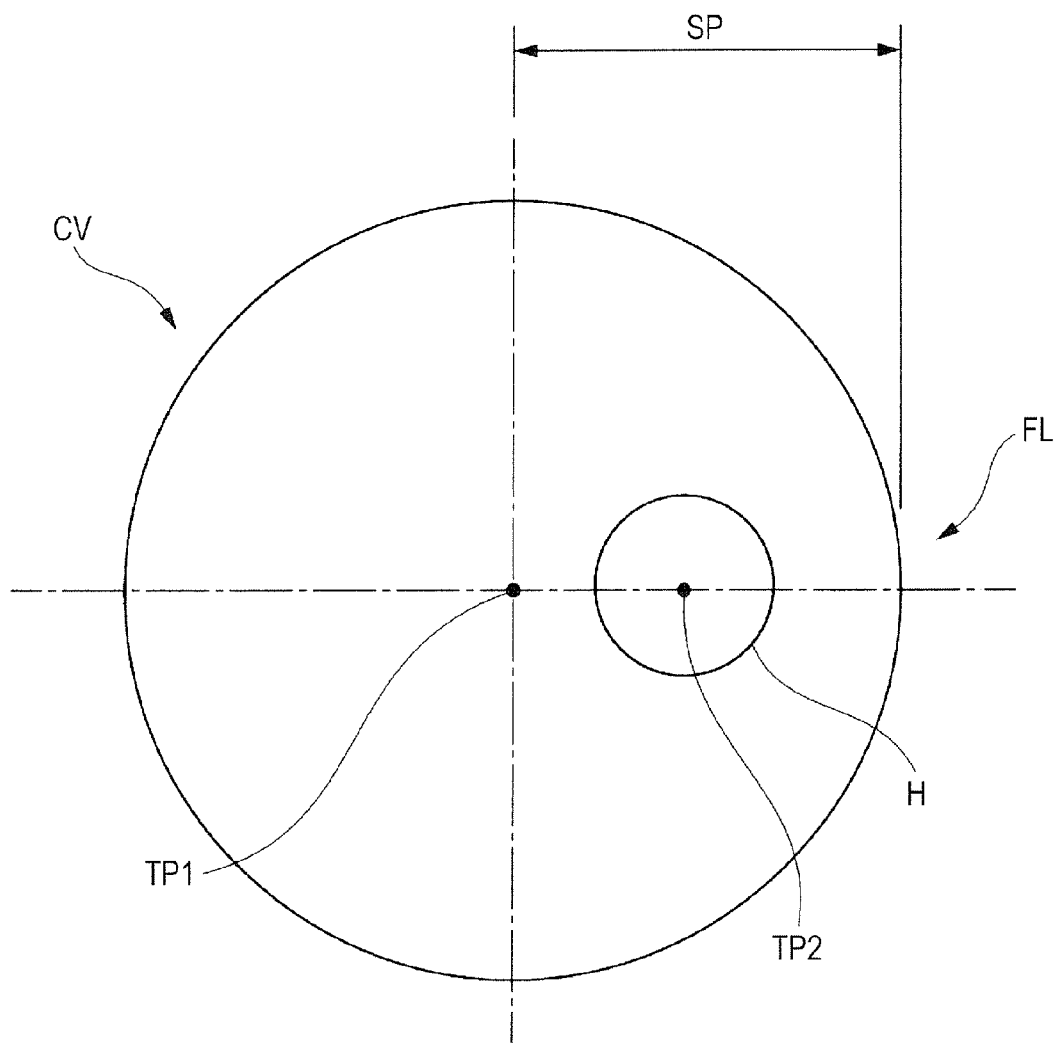
FIG. 9 is an enlarged plan view of a convex part in the protective sheet shown in FIG. 7.
Figure 10:
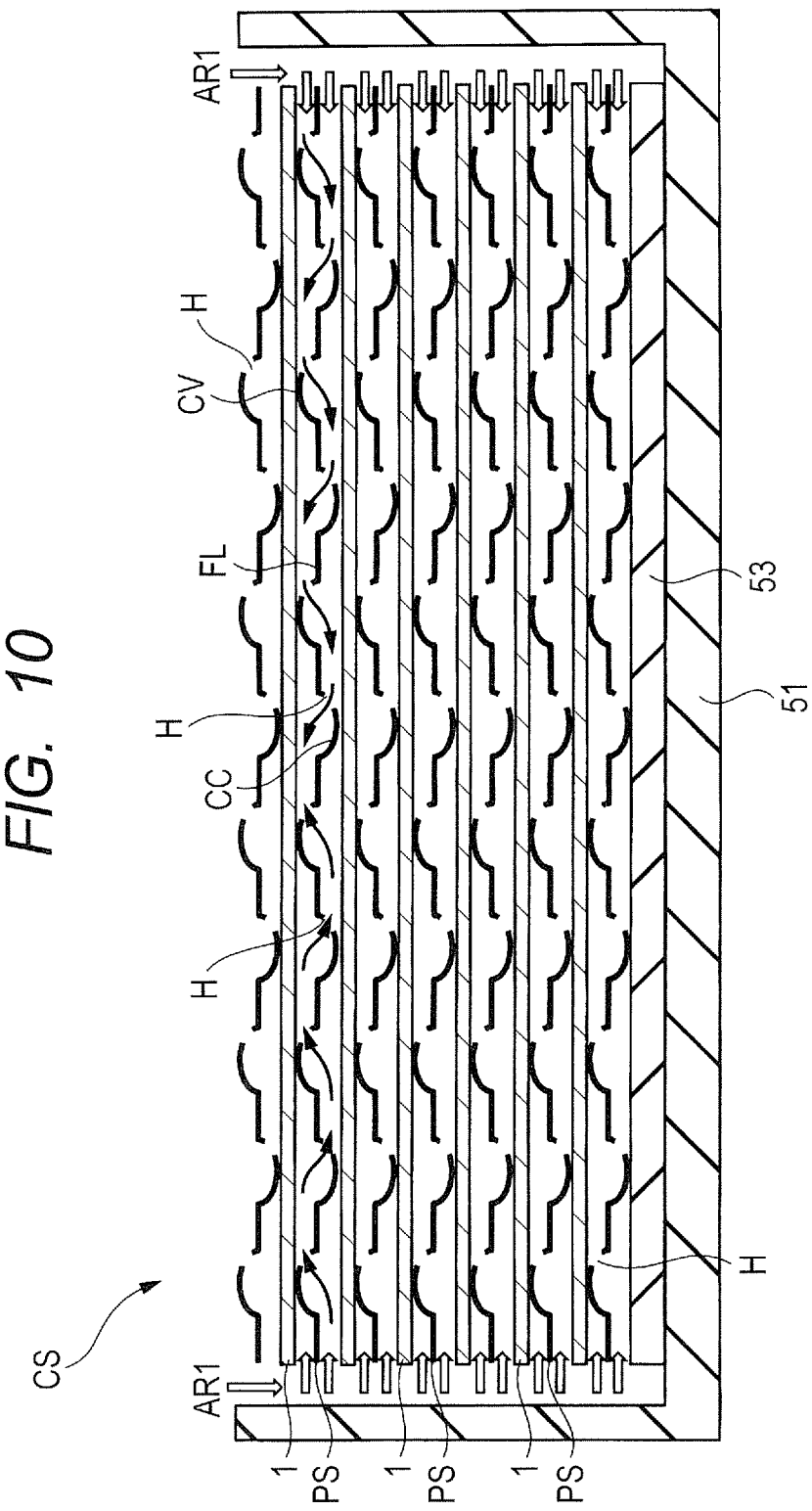
FIG. 10 is a sectional view showing a step in the semiconductor device manufacturing process according to the embodiment.
Figure 11:
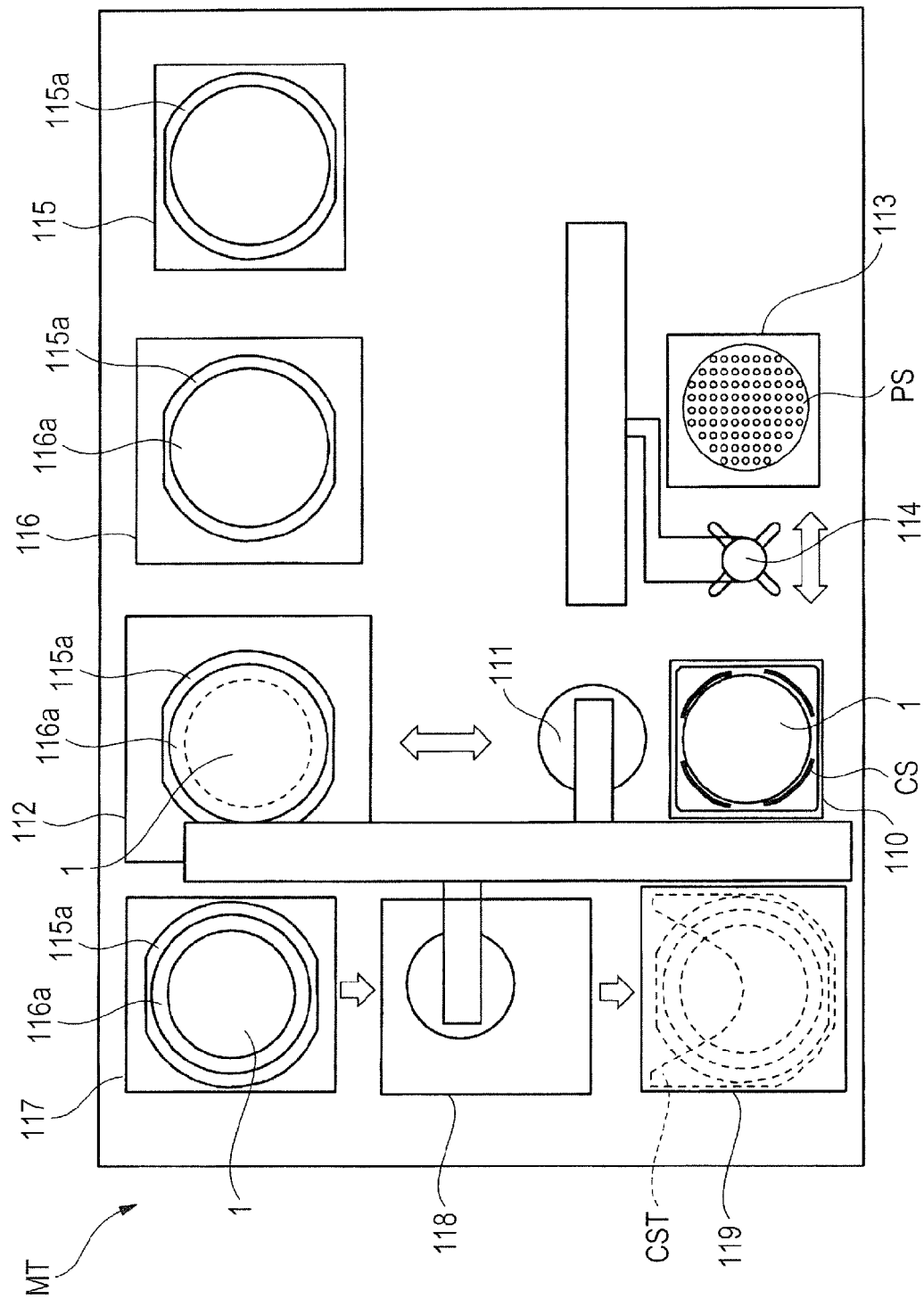
FIG. 11 is a plan view showing the configuration of a mounting device which is used in the semiconductor device manufacturing process according to the embodiment.
Figure 12:
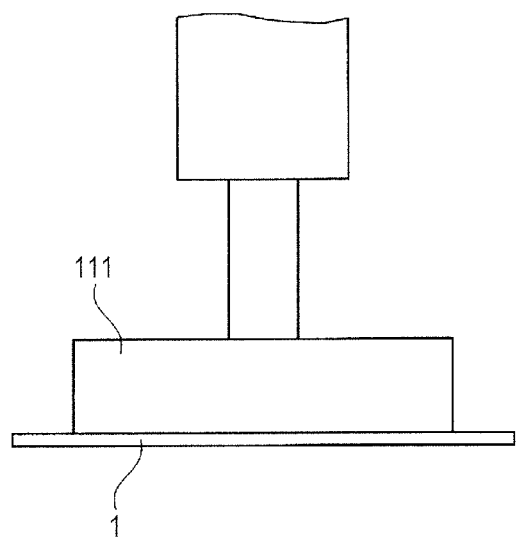
FIG. 12 is a fragmentary sectional view illustrating the mounting device shown in FIG. 11.
Figure 13:
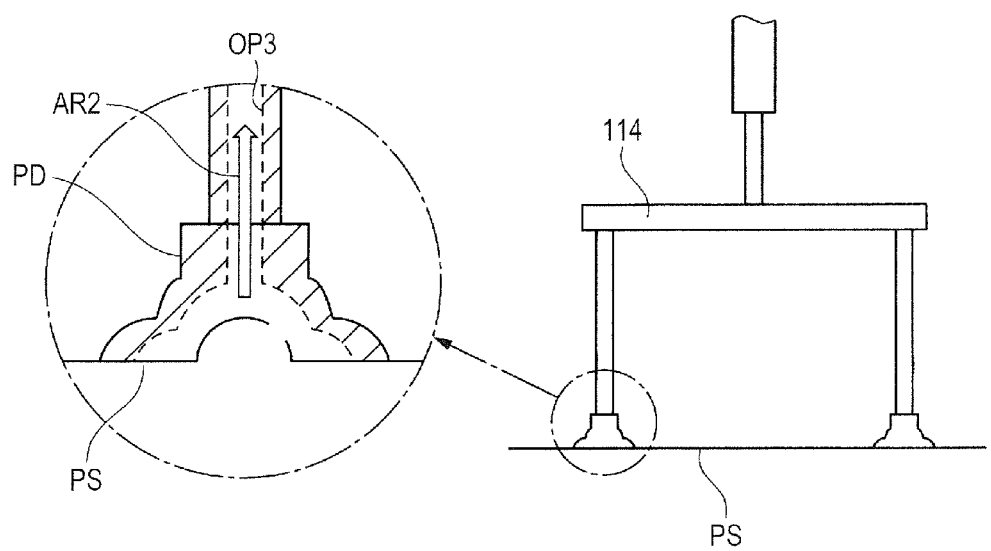
FIG. 13 is a fragmentary sectional view illustrating the mounting device shown in FIG. 11.

FIG. 1 is a process flow chart showing part of the semiconductor device manufacturing process according to the embodiment of the invention. FIG. 2 is a plan view of a semiconductor wafer according to the embodiment. FIG. 3 is a sectional view showing a step in the semiconductor device manufacturing process according to the embodiment. FIG. 4 is a sectional view showing a step subsequent to the step shown in FIG. 3. FIG. 5 is a perspective view showing the external appearance of a case according to the embodiment. FIG. 6 is a transparent view of the case sealed in the moisture-proof bag according to the embodiment. FIG. 7 is a plan view of a protective sheet according to the embodiment. FIG. 8 is a sectional view taken along the line X-X' of FIG. 7. FIG. 9 is an enlarged plan view of a convex part in the protective sheet shown in FIG. 7. FIG. 10 is a sectional view showing a step in the semiconductor device manufacturing process according to the embodiment. FIG. 11 is a plan view showing the configuration of a mounting device which is used in the semiconductor device manufacturing process according to the embodiment. FIGS. 12 and 13 are fragmentary sectional views of the mounting device shown in FIG. 11. FIGS. 14 to 17 are sectional views showing various steps in the semiconductor device manufacturing process according to the embodiment.

The semiconductor device in this embodiment is manufactured through the process shown in FIG. 1.

First, the step of "providing semiconductor wafers" shown in the process flow chart of FIG. 1 (Step S1) is carried out. Specifically, a semiconductor wafer having the structure as shown in FIGS. 2 and 3 is provided. FIG. 2 is a plan view of a semiconductor wafer 1. The semiconductor wafer 1 has a main surface and a back surface. FIG. 2 shows the main surface of the semiconductor wafer. A plurality of semiconductor chips (semiconductor chip regions) 1A and scribe regions SR are arranged on the main surface of the semiconductor wafer 1.

The semiconductor chips 1A are arranged on the main surface of the semiconductor wafer 1 in a matrix pattern and a scribe region SR lies between adjacent semiconductor chips 1A. The scribe regions SR are cutting margins for dividing the semiconductor wafer 1 into a plurality of individual semiconductor chips 1A, making up a lattice pattern in which a semiconductor chip 1A is located inside each square of the lattice pattern. Each semiconductor chip 1A has a rectangular planar shape and a plurality of bonding pads BP are arranged along each side of the semiconductor chip 1A on the periphery of the semiconductor chip 1A.

FIG. 3 is an enlarged sectional view of area A of FIG. 2. FIG. 3 shows two adjacent semiconductor chips 1A and a scribe region SR between them. Each semiconductor chip 1A has a plurality of semiconductor elements Q formed on the front surface of a semiconductor substrate 31 and in plan view, the periphery of each semiconductor element Q is covered by an element isolating film 32 which is, for example, a silicon oxide film. The semiconductor element Q is, for example, a MISFET (Metal Insulator Semiconductor Field Effect Transistor) and the MISFET has a gate electrode, a source region and a drain region. A plurality of metal wirings M1, M2, and M3 lie over the semiconductor elements Q and the metal wirings M1, M2, and M3 are formed over insulating films 33, 34, and 35, respectively. The metal wiring M3 is covered by an insulating film 36 except an area which is exposed from the insulating film 36 through an opening OP1 made in the insulating film 36. The exposed area of the metal wiring M3 from the insulating film 36 is a bonding pad BP. As shown in FIG. 3, the bonding pad BP formed in the exposed area of the metal wiring M3 is coupled to the semiconductor elements Q through the metal wirings M2 and M1. The metal wirings M1, M2, and M3 are metal layers mainly made of aluminum film, but instead the metal wirings M1 and M2 may be metal films mainly made of copper. An organic protective film (organic resin film) PI is formed over the insulating film 36 and the organic protective film PI has an opening OP2 which exposes the bonding pad BP. The opening OP2 is wider than the opening OP1 and the entire bonding pad BP is exposed from the opening OP2. The organic protective film PI has a slit SL in an area corresponding to a scribe region SR. Although not shown in FIG. 3, semiconductor elements Q and metal wirings M1 and M2 are formed in the semiconductor chip 1A on the left in the same way as in the semiconductor chip 1A on the right.

Then, the "back surface polishing" step (Step S2) in the process flow chart of FIG. 1 is carried out. As shown in FIG. 4, after a surface protective tape BGT made of polyethylene (PE) or polyethylene terephthalate (PET), etc. is attached to the main surface of the semiconductor wafer 1, the back surface of the semiconductor wafer 1 is polished with a grind stone until the film thickness of the semiconductor wafer 1 is reduced to one third to one half of the initial thickness. The semiconductor substrate 31 of the semiconductor wafer 1 is thus polished and thinned.

Then, the "wafer packaging" step (Step S3) in the process flow chart of FIG. 1 is carried out. As shown in FIG. 5, a plurality of semiconductor wafers 1 whose back surfaces have been polished are stacked with their back surfaces up while a protective sheet PS is interposed between semiconductor wafers, so that a semiconductor wafer laminate is formed. The surface protective tape BGT is attached to the main surface of each semiconductor wafer 1. The surfaces of the protective sheet PS are not different from each other. One surface of the protective sheet PS contacts the back surface of the semiconductor wafer 1 under it and the other surface is attached to the main surface of the semiconductor wafer 1 over it to contact the surface protective tape BGT. In FIG. 5, the surface protective tape BGT is omitted. The semiconductor wafer laminate is housed in a case CS with cushions 53 placed over and under the laminate. The case CS has a base 51 and a cover 52 and for example, the base 51 and the cover 52 can be fitted to each other and when they are fitted to each other, the semiconductor wafers 1 are pressed by the base 51 and the cover 52 through the cushions 53. Specifically, a protective sheet PS between two semiconductor wafers 1 which are vertically adjacent to each other is pressed by the two semiconductor wafers 1. This prevents vibration or displacement of the semiconductor wafers 1 during transportation of the semiconductor wafers 1. The case CS is not hermetically sealed, but it is communicated with the external air.

As shown in FIG. 6, the case housing a semiconductor wafer laminate is put in a moisture-proof bag 62 together with a desiccating agent 61 such as silica gel and the inside of the moisture-proof bag 62 is deaired (vacuumed), and then the moisture-proof bag 62 is sealed. The moisture-proof bag 62 is sealed through a sealing part 63, for example, by thermal welding. In other words, the case housing the semiconductor wafer laminate is hermetically sealed in the moisture-proof bag to make a package. Deairing is performed in order to prevent deterioration in the quality of the semiconductor wafers 1 due to moisture absorption, by making the moisture density in the moisture-proof bag 62 lower than in the atmospheric air. For example, deairing prevents or reduces corrosion of bonding pads BP, etc. The moisture-proof bag 62 is, for example, a polyester-based transparent bag with a moisture permeability of 2.0 g/m$^2$·24 hrs or less. Alternatively it may be a laminate bag which has an aluminum foil sandwiched between polyester layers.

FIG. 7 is a plan view of the protective sheet PS shown in FIG. 5 which is interposed between semiconductor wafers 1, FIG. 8 is a sectional view taken along the line X-X' of FIG. 7, and FIG. 9 is an enlarged plan view of a convex part CV. As shown in FIGS. 7 and 8, the protective sheet PS has a plurality of convex parts CV and a plurality of concave parts CC which are alternately arranged on one surface and the other surface and there is a flat part FL between a convex part CV and a concave part CC. A convex part CV on the one surface corresponds to a concave part CC on the other surface and a convex part CV on the other surface corresponds to a concave part CC on the one surface. A convex part CV and a concave part CC have a semispherical cross section as shown in FIG. 8 and the area between the center (apex) TP1 of the convex part CV and the flat part FL is called a slope SP. A circular hole H which penetrates the protective sheet PS is made in the slope SP of each convex part CV. In other words, the protective sheet PS has circular holes H which penetrate from the one surface to the other surface or from the other surface to the one surface. Here, the "circular" shape should be interpreted to include an incomplete circle or a circle whose circumference is partially missing. As shown in FIG. 9, a hole H is made within the slope SP and does not reach the center (apex) TP1 and the flat part FL. Alternatively the convex part CV may have an oval planar shape.

Then, the "transportation (by air)" step (Step S4) in the process flow chart of FIG. 1 is carried out. Specifically the package is transported (by air) from the factory for the front-end process to the factory for the back-end process.

During transportation, the convex parts CV of a protective sheet PS between semiconductor wafers 1 are crushed and reduced in height to about one third to one half but the hole H in the slope SP of each convex part CV is not crushed.

Then, the "unpacking" step (Step S5) in the process flow chart of FIG. 1 is carried out. Specifically, after the moisture-proof bag 62 is unsealed, the cover 52 of the case CS is removed from the base 51 and the cushion 53 on the cover 52 side is removed. Consequently, as shown in FIG. 10, air AR1 enters between semiconductor wafers 1 of the semiconductor wafer laminate and the crushed convex parts CV restore their original shape, so that the protective sheet PS can be easily peeled from the semiconductor wafer 1. In this embodiment, since a hole H penetrating the protective sheet PS is made in the slope SP of each convex part CV, the air AR1 entering between semiconductor wafers 1 passes through the hole H and moves downward from above the protective sheet PS and upward from under it to reach the center of the semiconductor wafer 1, so that the protective sheet PS is easily peeled from the semiconductor wafer 1. As shown in FIG. 9, the center TP2 of the hole H is located off (away from) the center (apex) TP1 of the convex part CV of the protective sheet PS. More specifically, the center TP2 of the hole H is closer to the periphery of the convex part CV (boundary between the convex part CV and the flat part FL) than to the center (apex) TP1 of the convex part CV. For this reason, even if the convex part CV of the protective sheet PS is crushed by the semiconductor wafer 1 or cushion 53, the hole H is not completely covered by the semiconductor wafer 1 or cushion 53 and the air AR1 can pass through it.

Next, the case that a convex part CV of the protective sheet PS does not have a hole H will be explained using an upper semiconductor wafer 1 and a lower semiconductor wafer 1 which sandwich the protective sheet PS. When a convex part CV of the protective sheet PS does not have a hole H, if, before the "unpacking" step, the periphery of the protective sheet PS is almost entirely sucked to the upper semiconductor wafer 1, after the unpacking step the air does not enter between the protective sheet PS and the upper semiconductor wafer 1 and thus the protective sheet PS is not peeled from the upper semiconductor wafer 1. Particularly, since the surface protective tape BGT is attached to the main surface of the semiconductor wafer 1, the protective sheet PS is easily sucked to it. Even if the surface protective tape BGT is not used, since an organic protective film PI is formed on the main surface of the semiconductor wafer 1, the protective sheet PS is easily sucked. Even if neither the organic protective film PI nor the surface protective tape BGT exists, it is apparent that the protective sheet PS is hardly peeled from the upper semiconductor wafer 1.

In this embodiment, since a hole H is made in the slope SP of each convex part CV of the protective sheet PS, after the "unpacking" step the air entering between the protective sheet PS and the lower semiconductor wafer 1 passes through the hole H and enters between the protective sheet PS and the upper semiconductor wafer 1 to reach the center of the semiconductor wafer 1, so that the protective sheet PS is easily peeled from the upper semiconductor wafer 1.

Then, the "mounting" step (Step S6) in the process flow chart of FIG. 1 is carried out. FIG. 11 is a plan view showing the configuration of a mounting device MT. The mounting device MT is a device for attaching a dicing tape 116a to the semiconductor wafer 1 after the "unpacking" step.

As shown in FIG. 11, the mounting device MT includes a case loading section 110, a wafer suction conveyance unit 111, a wafer mounting section 112, a protective sheet collecting section 113, a protective sheet suction conveyance unit 114, a ring frame supplying section 115, a taping section 116, an inverted wafer holding section 117, a surface protective tape removing section 118, and a cassette housing section 119.

After the "unpacking" step, the case CS housing a semiconductor wafer laminate is placed in the case loading section 110. Then, the wafer suction conveyance unit 11 vacuum-sucks the uppermost semiconductor wafer 1 of the semiconductor wafer laminate and conveys it to the wafer mounting section 112 and places it on the wafer mounting section 112 in a manner that the back surface of the semiconductor wafer 1 is exposed (visible). The semiconductor wafer 1 is placed on the stage (not shown) of the wafer mounting section 112 with its main surface down. Since the main surface of the semiconductor wafer 1 is protected by the surface protective tape BGT, the main surface of the semiconductor wafer 1 is not damaged.

After that, the protective sheet PS, exposed on the top of the semiconductor wafer laminate, is vacuum-sucked by the protective sheet suction conveyance unit 114 and conveyed to the protective sheet collecting section 113.

Then, a ring frame 115a provided in the ring frame supplying section 115 is conveyed to the taping section 116. At the taping section, a dicing tape 116a is attached to the upper surface of the ring frame 115a with its adhesive side down and the attached dicing tape 116a is trimmed along the circumference of the ring frame 115a.

Then, the dicing tape 116a attached to the ring frame 115a is attached to the back surface of the semiconductor wafer 1 held on the wafer mounting section 112 by suction.

Then, the ring frame 115 with the semiconductor wafer 1 attached to it is inverted from the wafer mounting section 112 and received by the inverted wafer holding section 117. Therefore, at the inverted wafer holding section 117, the main surface of the semiconductor wafer 1 is exposed. More specifically, the surface protective tape BGT attached to the main surface of the semiconductor wafer 1 is exposed.

Then, the surface protective tape removing section 118 removes the surface protective tape BGT from the main surface of the semiconductor wafer 1, and then the semiconductor wafer 1 attached to the dicing tape 116a and united with the ring frame 115a is put in a cassette CST. Subsequently, the same steps as above are repeated to attach a dicing tape 116a to another semiconductor wafer 1 in the case CS and put it in the cassette CST.

FIG. 12 is a sectional view which shows the wafer suction conveyance unit of the mounting device MT shown in FIG. 11 and FIG. 13 is a sectional view which shows the protective sheet suction conveyance unit 114 of the mounting device MT shown in FIG. 11.

As shown in FIG. 12, the semiconductor wafer 1 is held by suction in a contactless manner by the so-called Bernoulli chuck method in which air is blown from the wafer suction conveyance unit 111 along the back surface of the semiconductor wafer 1.

As shown in FIG. 13, the protective sheet suction conveyance unit 114 holds the protective sheet PS by sucking the dent of a rubber pad PD through an opening OP3. The protective sheet suction conveyance unit 114 has a plurality of pads PD and even if an air leakage occurs through a hole H in the protective sheet PS, the unit 114 continues to hold the protective sheet PS by suction.

According to this embodiment, since the protective sheet PS having a hole in each convex part CV is interposed between semiconductor wafers 1, after the "unpacking" step the semiconductor wafer 1 and the protective sheet PC can be easily separated from each other. Therefore, when the semiconductor wafer 1 is sucked and conveyed by the wafer suction conveyance unit 111, conveyance of the semiconductor wafer with the protective sheet PS sucked to the semiconductor wafer 1 is prevented. Also, when the protective sheet PS is sucked and conveyed by the protective sheet suction conveyance unit 114, the semiconductor wafer 1 is not conveyed together with the protective sheet PS.

Then, the "dicing" step (Step S7) in the process flowchart of FIG. 1 is carried out. Although not shown, the semiconductor wafer 1 attached to the dicing tape 116a and united with the ring frame 115a is placed on the stage of a dicing device and the dicing blade is run along the scribe regions SR shown in FIG. 2. A plurality of semiconductor chips 1A are thus obtained from the semiconductor wafer 1.

Figure 14:
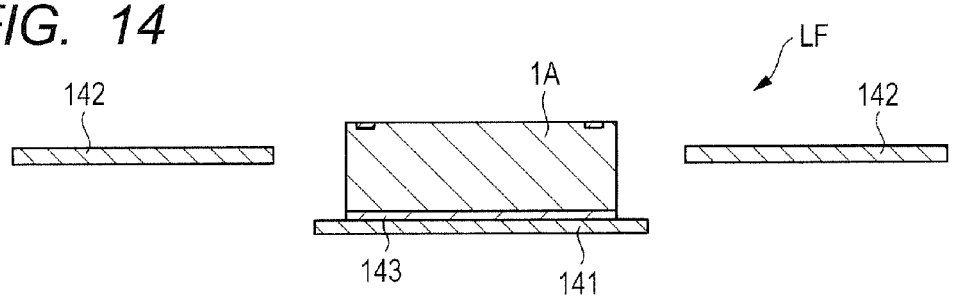
FIG. 14 is a sectional view showing a step in the semiconductor device manufacturing process according to the embodiment.

Then, the "die bonding" step (Step S8) in the process flow chart of FIG. 1 is carried out. As shown in FIG. 14, a lead frame LF having a plurality of leads 142 and a die pad 141 is provided and a semiconductor chip 1A is placed over the die pad 141 through an adhesive agent 143. The lead frame LF is, for example, a patterned copper plate.

Figure 15:
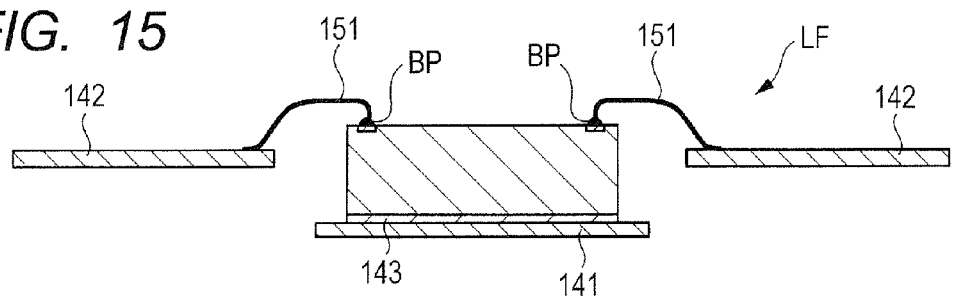
FIG. 15 is a sectional view showing a step subsequent to the step shown in FIG. 14 in the semiconductor device manufacturing process according to the embodiment.

Then, the "wire bonding" step (Step S9) in the process flowchart of FIG. 1 is carried out. As shown in FIG. 15, bonding pads BP on the main surface of the semiconductor chip 1A are coupled to the leads 142 by gold-based or copper-based wires 151.

Figure 16:
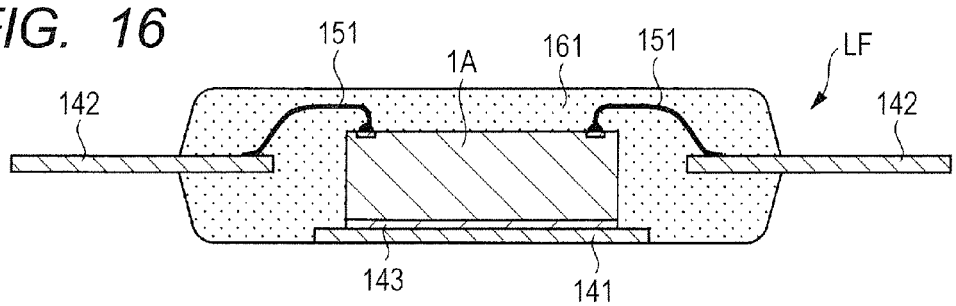
FIG. 16 is a sectional view showing a step subsequent to the step shown in FIG. 15 in the semiconductor device manufacturing process according to the embodiment.

Then, the "molding" step (Step S10) in the process flow chart of FIG. 1 is carried out. As shown in FIG. 16, the semiconductor chip 1A, parts of the leads 142, a part of the die pad 141, and the wires 151 are sealed, for example, with epoxy resin to make a sealing body 161.

Figure 17:
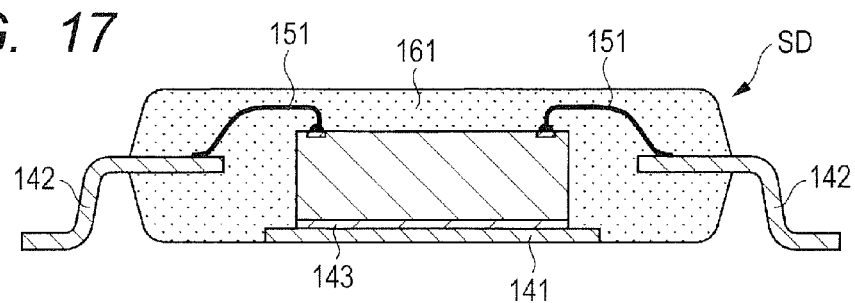
FIG. 17 is a sectional view showing a step subsequent to the step shown in FIG. 16 in the semiconductor device manufacturing process according to the embodiment.

Then, the "forming" step (Step S11) in the process flow chart of FIG. 1 is carried out. As shown in FIG. 17, outside the sealing body 161 the leads 142 are formed into a gull wing shape to complete a semiconductor device SD.

VARIATIONS

The invention made by the present inventors has been so far explained concretely in reference to the preferred embodiment thereof. However, the invention is not limited thereto and it is obvious that these details may be modified in various ways without departing from the gist thereof.

Variation 1

Figure 18:
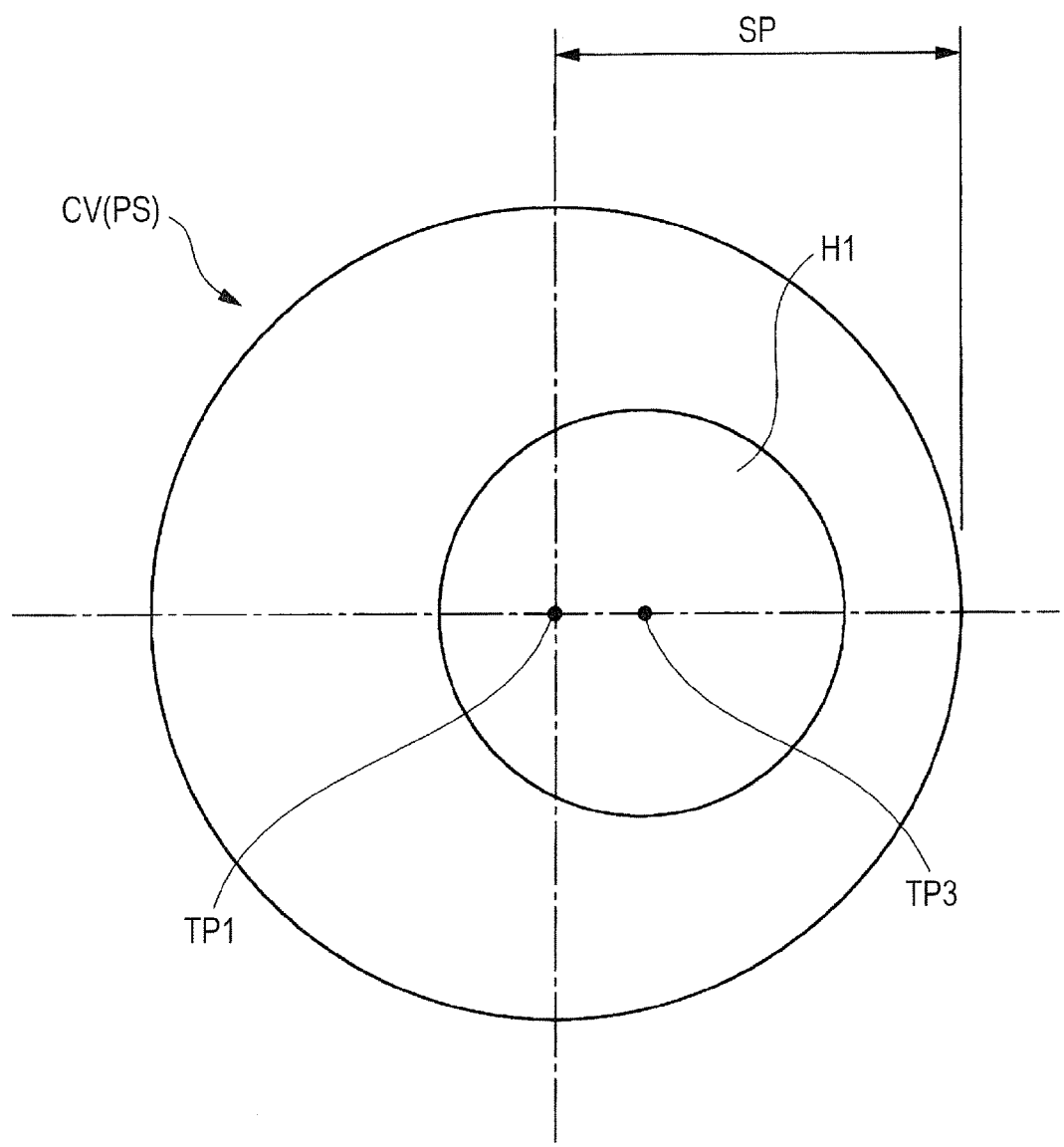
FIG. 18 is an enlarged plan view of a convex part as Variation 1 of the one shown in FIG. 9.

FIG. 18 is an enlarged plan view of a convex part as Variation 1 of the one shown in FIG. 9.

In Variation 1, a circular hole H1 made in a convex part CV of the protective sheet PS lies in the slope SP of the convex part CV and reaches the center (apex) TP1. The important point is that the center TP3 of the hole H1 is located off the center (apex) TP1 of the convex CV. The hole H1 may extend down to the flat part FL. Furthermore, the size of the hole H1 shown in FIG. 18 may be equal to the size of the hole H shown in FIG. 9. Here, the "circular" shape should be interpreted to include a circle whose circumference is partially missing.

However, since the distance between the center (apex) TP1 of the convex part CV of the protective sheet PS and the center TP3 of the hole H1 is shorter than in the above embodiment, if the convex part CV of the protective sheet PS is crushed by the semiconductor wafer 1 or cushion 53, the area of the hole H1 which is covered by the semiconductor wafer 1 or cushion 53 will be much larger than in the above embodiment and thus the air AR1 will hardly pass through it. Therefore, from the viewpoint of ensuring that the air AR1 passes through it, it is more desirable that the center TP3 of the hole H1 be located off the center (apex) TP1 of the convex part CV of the protective sheet PS as shown in FIG. 9.

Variation 2

Figure 19:
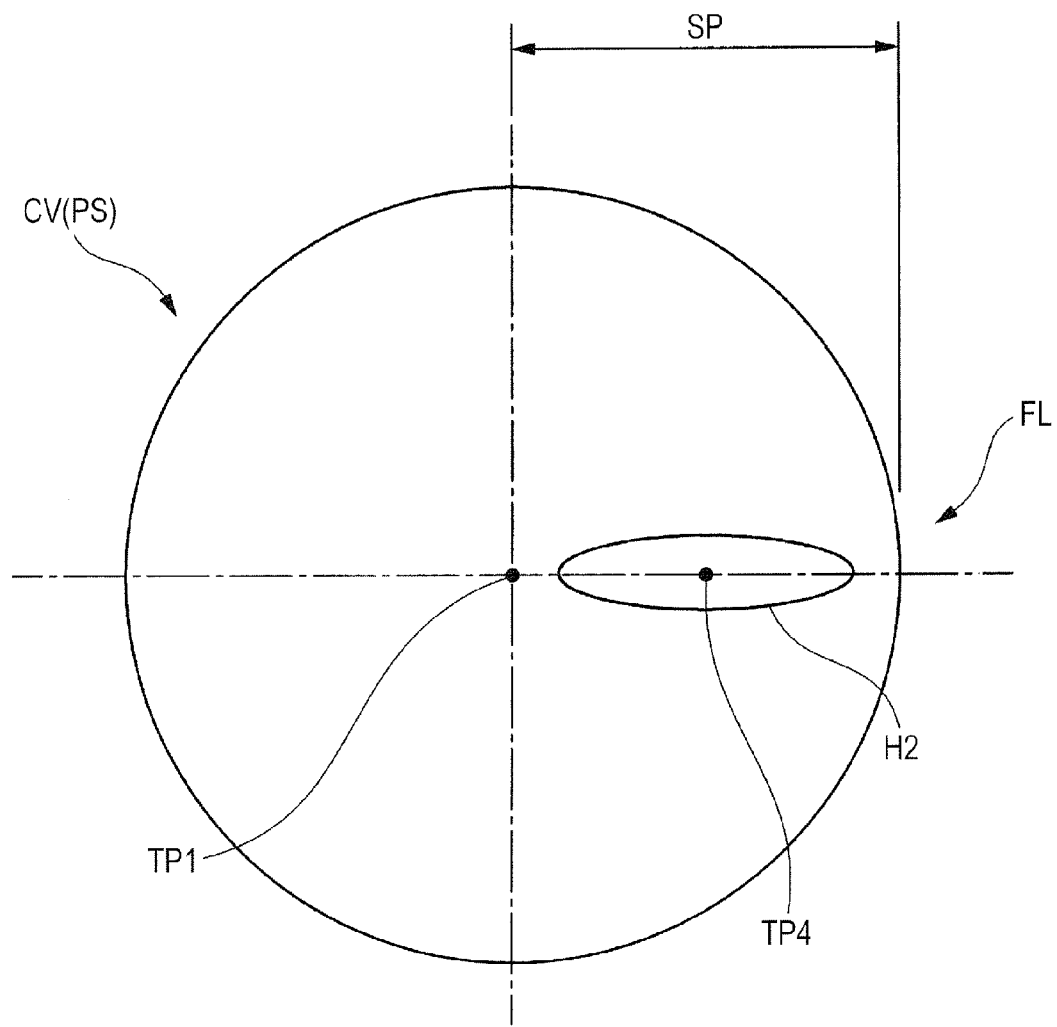
FIG. 19 is an enlarged plan view of a convex part as Variation 2 of the one shown in FIG. 9.

FIG. 19 is an enlarged plan view of a convex part as Variation 2 of the one shown in FIG. 9.

In Variation 2, a hole H2 made in a convex part CV of the protective sheet PS is oval. The lengths of the long and short sides of the oval can be determined arbitrarily. The hole H2 is made in the slope CP of the convex part CV and the important point is that the center TP4 of the hole H2 as the point of intersection between the long and short sides of the oval is located off the center (apex) TP1 of the convex CV. The hole H2 may extend down to the flat part FL. Here, the oval should be interpreted to include an oval whose circumference is partially missing.

Variation 3

Figure 20:
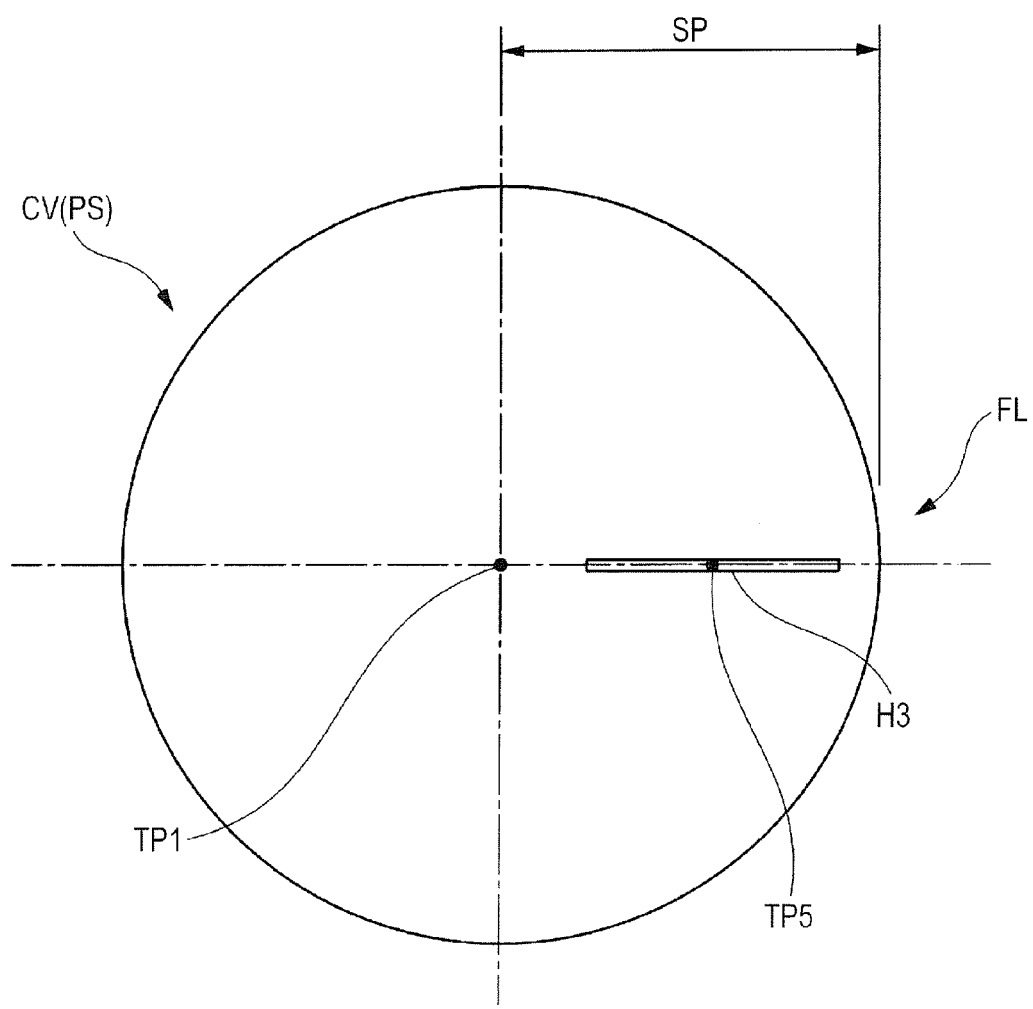
FIG. 20 is an enlarged plan view of a convex part as Variation 3 of the one shown in FIG. 9.

FIG. 20 is an enlarged plan view of a convex part as Variation 3 of the one shown in FIG. 9.

In Variation 3, a hole H3 made in a convex part CV of the protective sheet PS is a rectangular slit. The lengths of the long and short sides of the rectangle can be determined arbitrarily. The hole H3 is made in the slope SP of the convex part CV and the important point is that the center TP5 of the hole H3 as the point of intersection between the diagonals of the rectangle is located off the center (apex) TP1 of the convex CV. The hole H3 may extend down to the flat part FL. Although the hole may have the shape of a polygon instead of a rectangle, in that case as well it is important that the center of the polygon is located off the center (apex) TP1 of the convex CV.

Some details of the embodiment described above are given below.

(Note 1)

A wafer protective sheet including:

a flat part having a first surface and a second surface opposite to the first surface;

a plurality of convex parts projecting from the flat part toward the first surface; and a plurality of concave parts projecting from the flat part toward the second surface;

in which a first hole penetrating the protective sheet is made between the apex of the convex part and the flat part in the convex part.

(Note 2)

The protective sheet described in Note 1, in which the first hole lies in a slope between the apex and the flat part and the first hole does not reach the apex.

(Note 3)

The protective sheet described in Note 2, in which the first hole is oval in plan view.

(Note 4)

The protective sheet described in Note 2, in which the first hole is a slit in plan view.

(Note 5)

The protective sheet described in Note 1, in which the first hole is circular in plan view.

(Note 6)

The protective sheet described in Note 5, in which the convex part is circular in plan view and the center of the circular first hole is located off the center of the circular convex part.

(Note 7)

The protective sheet described in Note 1, in which
a second hole penetrating the protective sheet is made in the concave part.

What is claimed is:

1. A semiconductor device manufacturing method comprising the steps of:
    (a) providing a plurality of semiconductor wafers each having a plurality of chip regions arranged in a matrix pattern over a main surface of a semiconductor substrate and scribe regions arranged between the chip regions in a lattice pattern;
    (b) sealing a semiconductor wafer laminate in which the semiconductor wafers are stacked with a protective sheet interposed between semiconductor wafers, in a moisture-proof bag to package the semiconductor wafer laminate;
    (c) transporting the packaged semiconductor wafer laminate by air;
    (d) taking the semiconductor wafer laminate out of the moisture-proof bag and then sucking and moving a first semiconductor wafer of the semiconductor wafer laminate to a stage by a first suction unit and attaching a tape to a back surface of the first semiconductor wafer; and
    (e) forming a plurality of semiconductor chips by cutting the first semiconductor wafer along the scribe regions,
    wherein the protective sheet has a first surface and a second surface opposite to the first surface and the first surface has a flat part, a plurality of convex parts projecting from the flat part toward the first surface, and a plurality of concave parts projecting from the flat part toward the second surface,
    wherein a first hole penetrating the protective sheet is made in the convex part, and
    wherein a center of the first hole is located off an apex of the convex part in plan view.

2. The semiconductor device manufacturing method according to claim 1, wherein the first hole is made in a slope between the apex and the flat part and the first hole does not reach the apex.

3. The semiconductor device manufacturing method according to claim 2, wherein the first hole is oval in plan view.

4. The semiconductor device manufacturing method according to claim 2, wherein the first hole is a slit in plan view.

5. The semiconductor device manufacturing method according to claim 1, wherein the first hole is circular in plan view.

6. The semiconductor device manufacturing method according to claim 1, wherein a second hole penetrating the protective sheet is made in the concave part.

7. The semiconductor device manufacturing method according to claim 1, wherein the semiconductor wafer laminate has the first semiconductor wafer and a second semiconductor wafer which are arranged in a manner to sandwich the protective sheet and the protective sheet lies between the main surface of the first semiconductor wafer and the back surface of the second semiconductor wafer.

8. The semiconductor device manufacturing method according to claim 7, the step (d) comprising the step of:
    (d-1) moving the first semiconductor wafer and then removing the protective sheet by a second suction unit to expose a back surface of the second semiconductor wafer.

9. The semiconductor device manufacturing method according to claim 1, wherein a resin film is formed over the main surface of the semiconductor wafer.

10. A semiconductor device manufacturing method comprising the steps of:
    (a) providing a first semiconductor wafer and a second semiconductor wafer each having a plurality of chip regions arranged in a matrix pattern over a main surface of a semiconductor substrate and scribe regions arranged between the chip regions in a lattice pattern;
    (b) attaching a first tape to the main surface of the first semiconductor wafer and a second tape to the main surface of the second semiconductor wafer and then polishing back surfaces of the first semiconductor wafer and the second semiconductor wafer;
    (c) putting a semiconductor wafer laminate with a protective sheet interposed between the first tape over the main surface of the first semiconductor wafer and the back surface of the second semiconductor wafer, in a moisture-proof bag and sealing the semiconductor wafer laminate in the moisture-proof bag to package the semiconductor wafer laminate;
    (d) transporting the packaged semiconductor wafer laminate by air;
    (e) taking the semiconductor wafer laminate out of the moisture-proof bag and then sucking the back surface of the first semiconductor wafer by a first suction unit, moving the first semiconductor wafer and the first tape onto a stage and attaching a third tape to the back surface of the first semiconductor wafer;
    (f) peeling the first tape from the first semiconductor wafer to expose the main surface of the first semiconductor wafer; and
    (g) forming a plurality of semiconductor chips by cutting the first semiconductor wafer along the scribe regions,
    wherein the protective sheet has a first surface and a second surface opposite to the first surface and the first surface has a flat part, a plurality of convex parts projecting from the flat part toward the first surface, and a plurality of concave parts projecting from the flat part toward the second surface,
    wherein a first hole penetrating the protective sheet is made in the convex part, and
    wherein a center of the first hole is closer to a periphery of the convex part than to an apex of the convex part in plan view.

11. The semiconductor device manufacturing method according to claim 10, wherein the first hole is made in a slope between the apex and the flat part and the first hole does not reach the apex.

12. The semiconductor device manufacturing method according to claim 10, wherein a second hole penetrating the protective sheet is made in the concave part.

13. The semiconductor device manufacturing method according to claim 10, the step (e) comprising the step of:
    (e-1) moving the first semiconductor wafer and the first tape and then removing the protective sheet by a second suction unit to expose the back surface of the second semiconductor wafer.

14. A semiconductor device manufacturing method comprising the steps of:
    (a) providing a plurality of semiconductor wafers each having a plurality of chip regions arranged in a matrix pattern over a main surface of a semiconductor substrate and scribe regions arranged between the chip regions in a lattice pattern;
    (b) sealing a semiconductor wafer laminate in which the semiconductor wafers are stacked with a protective sheet interposed between semiconductor wafers, in a moisture-proof bag to package the semiconductor wafer laminate;
(c) transporting the packaged semiconductor wafer laminate by air;
(d) taking the semiconductor wafer laminate out of the moisture-proof bag and then sucking and moving a first semiconductor wafer of the semiconductor wafer laminate to a stage by a first suction unit and attaching a tape to a back surface of the first semiconductor wafer; and
(e) forming a plurality of semiconductor chips by cutting the first semiconductor wafer along the scribe regions,
wherein the protective sheet has a first surface and a second surface opposite to the first surface and the first surface has a flat part, a plurality of convex parts projecting from the flat part toward the first surface, and a plurality of concave parts projecting from the flat part toward the second surface, and
wherein a first hole penetrating the protective sheet is made between an apex of the convex part and the flat part.

* * * * *